(12) United States Patent
Vasishta et al.

(10) Patent No.: US 6,823,499 B1
(45) Date of Patent: Nov. 23, 2004

(54) METHOD FOR DESIGNING APPLICATION SPECIFIC INTEGRATED CIRCUIT STRUCTURE

(75) Inventors: Ronnie Vasishta, Mountain View, CA (US); Gary Delp, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 63 days.

(21) Appl. No.: 10/245,140

(22) Filed: Sep. 16, 2002

Related U.S. Application Data (60) Provisional application No. 60/323,430, filed on Sep. 18, 2001.

(51) Int. Cl.[7] ............................. G00F 17/50; G06F 9/45
(52) U.S. Cl. ................................. 716/7; 716/9; 716/13
(58) Field of Search ........................................ 716/7–17

(56) References Cited

U.S. PATENT DOCUMENTS

| | | | | |
|---|---|---|---|---|
| 5,929,469 | A | * | 7/1999 | Mimoto et al. ............... 257/208 |
| 6,182,271 | B1 | * | 1/2001 | Yahagi ........................ 716/10 |
| 6,242,767 | B1 | | 6/2001 | How et al. |
| 6,308,307 | B1 | * | 10/2001 | Cano et al. .................... 716/8 |
| 6,397,375 | B1 | * | 5/2002 | Block et al. .................. 716/14 |
| 6,519,750 | B2 | * | 2/2003 | Yamashita .................... 716/10 |
| 6,532,580 | B1 | * | 3/2003 | Josephson et al. ............. 716/10 |
| 6,536,028 | B1 | * | 3/2003 | Katsioulas et al. ............ 716/17 |
| 6,542,834 | B1 | * | 4/2003 | Dixit ............................ 702/65 |
| 6,546,534 | B1 | * | 4/2003 | Nomura et al. ................ 716/10 |
| 6,564,355 | B1 | * | 5/2003 | Smith et al. .................... 716/4 |
| 6,587,991 | B1 | * | 7/2003 | Mbouombouo et al. ........ 716/2 |
| 6,601,227 | B1 | * | 7/2003 | Trimberger ................... 716/12 |
| 6,611,943 | B2 | * | 8/2003 | Shibata et al. .................. 716/1 |
| 6,629,309 | B1 | * | 9/2003 | Allen, III ..................... 716/16 |

* cited by examiner

*Primary Examiner*—Vuthe Siek
*Assistant Examiner*—Paul Dinh
(74) *Attorney, Agent, or Firm*—Thelen, Reid & Priest, LLP (57) ABSTRACT

A method for designing an Application Specific Integrated Circuit (ASIC) structure on a semiconductor substrate, includes (a) defining a class of circuit designs, the class having a common design part shared within the class and a custom design part variable for individual designs in the class, (b) allocating a set of bottom layers and a set of top metal layers to implement the common design part, the allocated sets of bottom layers and top metal layers having a fixed pattern for the class, and (c) implementing the custom design part using metal layers above the allocated set of bottom layers and below the allocated set of top metal layers. The method may further includes characterizing the ASIC for the common design and using the fixed patterns of the allocated set of bottom layers and the allocated set of top metal layers.

33 Claims, 5 Drawing Sheets

| | |
|---|---|
| PASSIVATION-CU-ETCH | Common |
| PASSIVATION-PAD-ETCH | Common |
| Metal-R2 | Common |
| Via-R2 | Common |
| Metal-R1 | Common |
| Via-R1 | Common |
| METAL7-CU-ETCH | Common |
| VIA6-CU-ETCH | Common |
| METAL6-CU-ETCH | Common |
| VIA5-CU-ETCH | Common |
| METAL5-CU-ETCH | Common |
| VIA4-CU-ETCH | Custom |
| METAL4-CU-ETCH | Custom |
| VIA3-CU-ETCH | Custom |
| METAL3-CU-ETCH | Custom |
| VIA2-CU-ETCH | Custom |
| METAL2-CU-ETCH | Custom |
| VIA1-CU-ETCH | Custom |
| METAL1-CU-ETCH | Custom |
| CONTACT-METAL-ETCH | Custom(Common/Custom) |
| RPO-ETCH | Common |
| S/D-P-IMP | Common |
| S/D-N-IMP | Common |
| LDD-P-1.2V-IMP | Common |
| LDD-N-1.2V-IMP | Common |
| LDD-N-HV-IMP | Common |
| POLY-GATE-ETCH | Common |
| POLY-N-LOAD-IMP | Common |
| OD2-ETCH | Common |
| VT-NH-IMP | Common |
| VT-NL-IMP | Common |
| WELL-P-IMP | Common |
| VT-P-DEPLETION-IMP | Common |
| VT-P-LV-IMP | Common |
| WELL-N-IMP | Common |
| ODR-Etch | Common |
| OD1-Etch | Common |

*FIG._4*

METHOD FOR DESIGNING APPLICATION SPECIFIC INTEGRATED CIRCUIT STRUCTURE

RELATED APPLICATION AND PRIORITY CLAIM

This application claims the benefit of provisional U.S. Patent Application Ser. No. 60/323,430 filed on Sep. 18, 2001 in the names of the same inventors.

FIELD OF THE INVENTION

The present invention relates to integrated circuit designs. More particularly, the present invention relates to a method for designing Application Specific Integrated Circuits (ASICs) structure.

BACKGROUND OF THE INVENTION

An ASIC is a semiconductor device designed especially for a particular application or use. The ASIC technology includes two major categories: Array-Based and Cell-Based. Array-Based ASICs configure a customer's design at the metal layers, whereas Cell-Based ASICs are uniquely fabricated at all layers of the silicon process including the diffusion layers. Here, a "layer" means a mask layer. Here, "masks" are the shapes used for processing features in a particular process step of integrated circuit production.

Array-Based ASIC products include an array of repeating identical base cells (or "gates") in a core region of a semiconductor chip. Each of such base cells contains the same predetermined number and arrangement of transistors. For example, a "gate" may be a two-input NAND gate including four CMOS transistors, two n-channel transistors and two p-channel transistors. Gate arrays contain more gates than will be used to implement the custom design because of their general-purpose nature. In conventional Array-Based architectures, all metal layers from Metal-1 layer and above (back-end layers) are processed to complete a design definition. The diffusion layers (front-end layers) have already been completed by the silicon foundry, as a pre-constructed general-purpose silicon, before implementing the customer design. Array-Based ASICs offer fast implementation of a customer's logic design onto a piece of silicon because of the smaller number of masks (and attendant process steps) required to define the specific function of the chip.

Cell-Based ASICs generally employ many different base cells, as opposed to a single repeating base cell. Typically, these various base cells have different sizes, shapes, transistor arrangements, etc., and the cells can be located anywhere on the die in accordance with a given circuit design. Because base cell choice and their arrangement are fully customized to a given integrated circuit design, Cell-Based ASICs use available chip space more efficiently than Array-Based ASICs. Cell-Based ASICs are uniquely fabricated at all layers of the silicon process including the diffusion layers, and thus one design is very difficult to modify to perform another function or customer design. Since all masks are unique and customized per design, it takes significant time to implement a specific circuit design or make any changes thereto.

The ASIC technology also includes Application Specific Standard Products (ASSPs) and Embedded Arrays. ASSPs are also full custom chips, but they have been designed and defined by the ASSP vendor, rather than by a particular customer, so as to fit specific system requirements and may be used by one or many customers. Embedded Array technology is a hybrid of Array-Based and Cell-Based architectures. In Embedded Array products, large memories and/or cores are first embedded into a circuit design and then the area around the large cells is filled with standard gate array transistors (masterslice structure). The chip is customized because the customer design defines the large cells and their locations. However, the random logic area is designed and laid out using the standard gate array areas. In an Embedded Array design, all masks are still customized for a specific circuit design, and if some design changes are made, all of the metal layers, including the top metal layers, are used to implement the given change.

In order to implement a given circuit design or changes thereto in a conventional Array-Based or Embedded Array ASIC architecture, a full set of metal masks must be manufactured and the full process steps in the back end from contact layer upwards must be processed. As process technologies employ a larger number of metal layers and/or tighter critical dimensions, however, it is becoming very costly and time-consuming to change the entire mask set and perform the entire metalization process for all of the metal layers. This also diminishes the advantages of the gate array products, including Array-Based and Embedded Array ASICs, over Cell-Based products., However, since today's circuit systems have short lifetimes, time-to-market and cost for manufacturing can be significantly important considerations.

On the other hand, a metal-only Engineering Change Order (ECO) also provides for implementing changes in a customer design using metal layers. However, the conventional process of metal-only ECO is not capable of implementing a new circuit design or major design changes, and is typically used to implement very limited design changes such as fixing bugs of an existing circuit design.

Accordingly, it would be desirable to provide a method for designing ASIC structures that reduces the mask costs and improves the turn around time, yet providing sufficient accommodation of customer designs and design changes.

BRIEF DESCRIPTION OF THE INVENTION

A method for designing an Application Specific Integrated Circuit (ASIC) structure on a semiconductor substrate, includes (a) defining a class of circuit designs, the class having a common design part shared within the class and a custom design part variable for individual designs in the class, (b) allocating a set of bottom layers and a set of top metal layers to implement the common design part, the allocated sets of bottom layers and top metal layers having a fixed pattern for the class, and (c) implementing the custom design part using metal layers above the allocated set of bottom layers and below the allocated set of top metal layers. The method may further includes characterizing the ASIC for the common design using the fixed patterns of the allocated set of bottom layers and the allocated set of top metal layers.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method for designing Application Specific Integrated Circuit (ASIC) structure. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
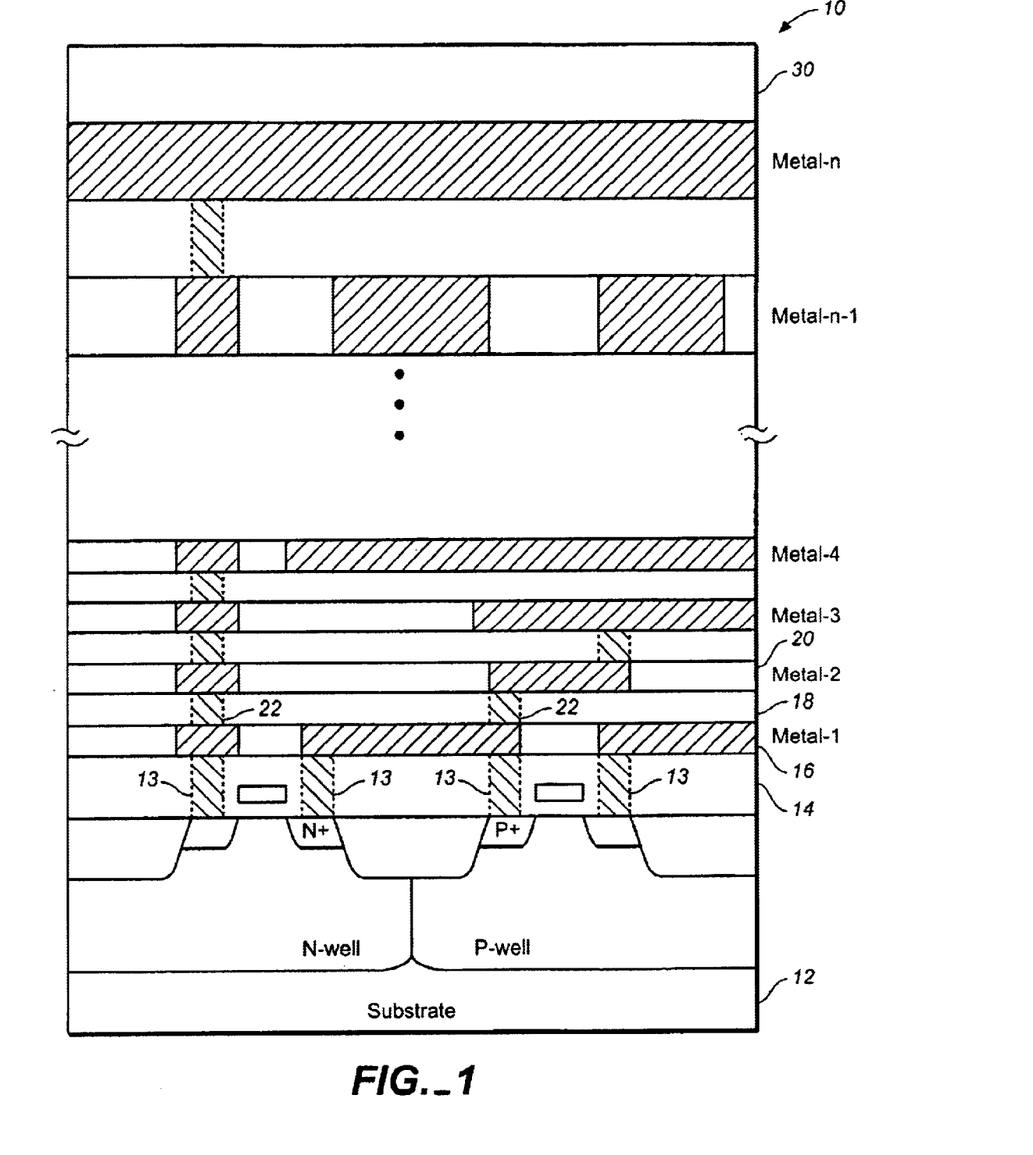
FIG. 1 is a diagram schematically illustrating a cross sectional view of a typical ASIC structure.

FIG. 1 schematically illustrates a cross sectional view of a typical ASIC structure 10. The ASIC structure 10 is formed on a semiconductor substrate 12. As is well known to those of ordinary skill in the art, a number of diffusion masks (mask layers) are used to form a number of transistors that are the building blocks of logic gates and cells. FIG. 1 shows two of such transistors. The mask layers include, for example, masks for forming buried layers and isolation (such as well structures), base diffusion, and emitter diffusion, masks for patterning gate electrodes, and the like. Typically, a contact layer is used for providing input and output connections to cell transistors formed on the base wafer through an insulation film 14. In the ASIC structure 10, Matal-1 (metalization layer 16) interconnects the inputs and outputs so as to define function blocks. Inter-level dielectric is disposed between metal wiring layers (such as an inter-level dielectric/insulation film 18 between Metal-1 16 and Matal-2 20). A corresponding mask is used to form via holes 22 in the insulation film 18. The ASIC structure 10 includes n wiring layers (Metal-1 to Metal-n). A surface passivation film 30 is formed above the top wiring layer (Metal-n).

Figure 2A:
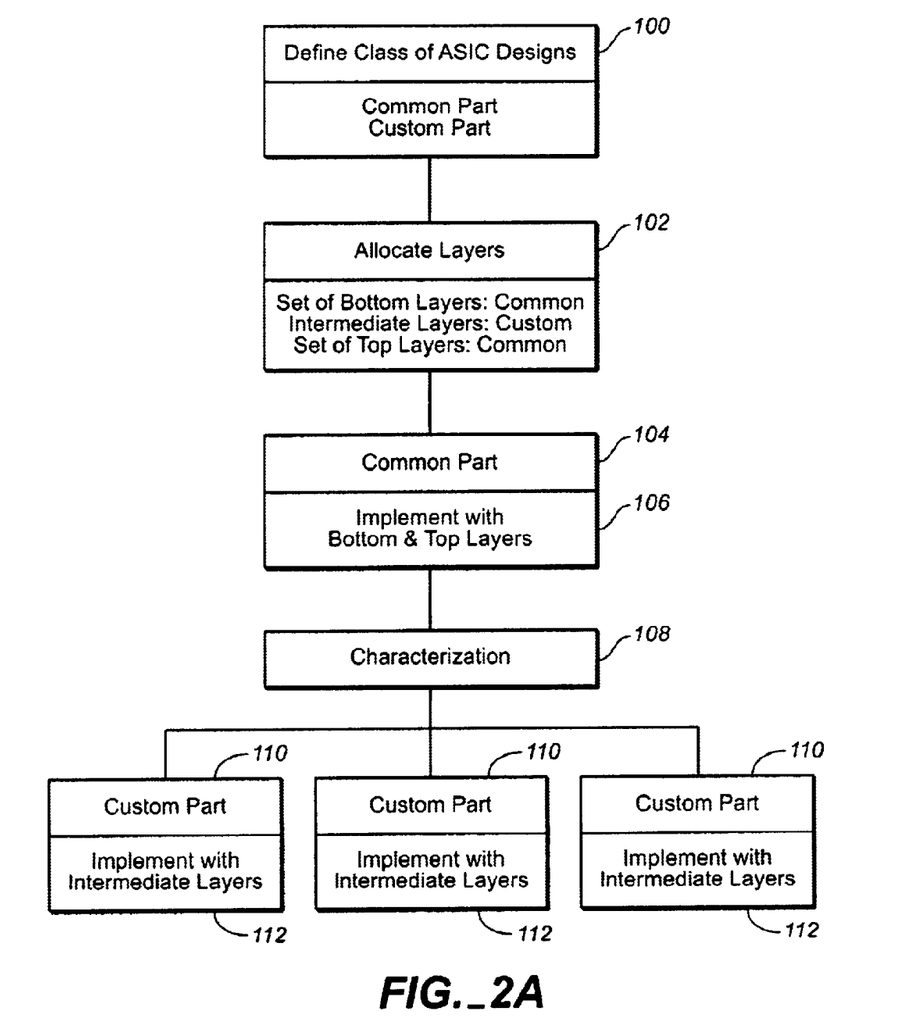
FIG. 2A is a diagram schematically illustrating a method for designing an ASIC structure on a semiconductor substrate in accordance with one embodiment of the present invention.

FIG. 2A schematically illustrates a method for designing an ASIC structure on a semiconductor substrate, in accordance with one embodiment of the present invention. First, a class of circuit designs is defined (100). For example, ASIC design families are examined so as to define a class that has a common design part and a unique/custom design part. The common design part is shared by all of the circuit designs within the class, and the unique/custom part is variable for individual designs of the class. The common design part may include hard macros or "macro cells", and the unique/custom design part may include soft macros. A specific set of macro cells may define a class within which various soft macros are customized. One or more classes can be defined from examining the same set of ASIC design families, for example, depending on the macro cells and their types included in the common part.

Mask layers for the entire process are allocated to the common design part or to the unique/custom design part of the class (102). For example, a set of bottom layers and a set of top metal layers are allocated to implement the common design. The allocated sets of bottom layers and top metal layers have a fixed pattern for the class. Intermediate layers, including metal layers above the allocated set of bottom layers and below the allocated set of top metal layers, are allocated to implement the unique/custom design.

The layer allocation may be based on logical hierarchy of designing the ASIC. For example, such hierarchy includes forming cell transistors, defining cells, connecting cells to create functional modules, connecting modules to define a specific circuit design, and the like. The layer allocation may also be based on circuit functions, such as power distribution, clock distribution, bus routing, long distance low resistivity connections, and the like. In other words, one or more specific layers may be allocated to implement a specific designing function or logical function of the circuit. A specific layer (for example, the contact layer) may be allocated to the common part for one design or class, and to the unique/custom part for another design or class. It should be noted that the common part of the design is used to specify the shapes in the layers that are common, and also, portions of the common part of the design will specify shapes on the custom layers. That is, the "custom" layers include elements which are common to all of the designs (I/O connections, PLL forms, etc.) and also the custom shapes which make up the custom parts of the design.

The common part of the design (104) is implemented using the allocated set of bottom layers and the allocated set of top layers (106). In accordance with one embodiment of the present invention, the allocated bottom layers may include all of the diffusion layers up to the gate layer. Using the allocated set of bottom layers, a base wafer design may be defined for the class. For example, base cell transistors are defined and formed with these allocated bottom layers according to the common circuit design. The allocated bottom layers may be used to define transistors for memory cells and/or and input-output (I/O) cells in predetermined locations for the common design.

In accordance with one embodiment of the present invention, the allocated bottom layers may also include at least one bottom metal layer. Such bottom metal layer(s) may be used to connect the transistors so as to define base logic cells of a structured array, and to connect the base logic cells so as to create modules common to the design class. For example, the contact layer and the first metal layer (for Metal-1), and optionally the second metal layer (for Metal-2) may be used to define the ASIC base wafer structure, and may be used exclusively for layout of the basic cell architecture within a structured array. In a specific embodiment, Metal-1 and Metal-2 are used to implement the basic cell architecture. The pattern of these lower metal layers is fixed and becomes part of the base wafer definition for the circuit design family.

Figure 2B:
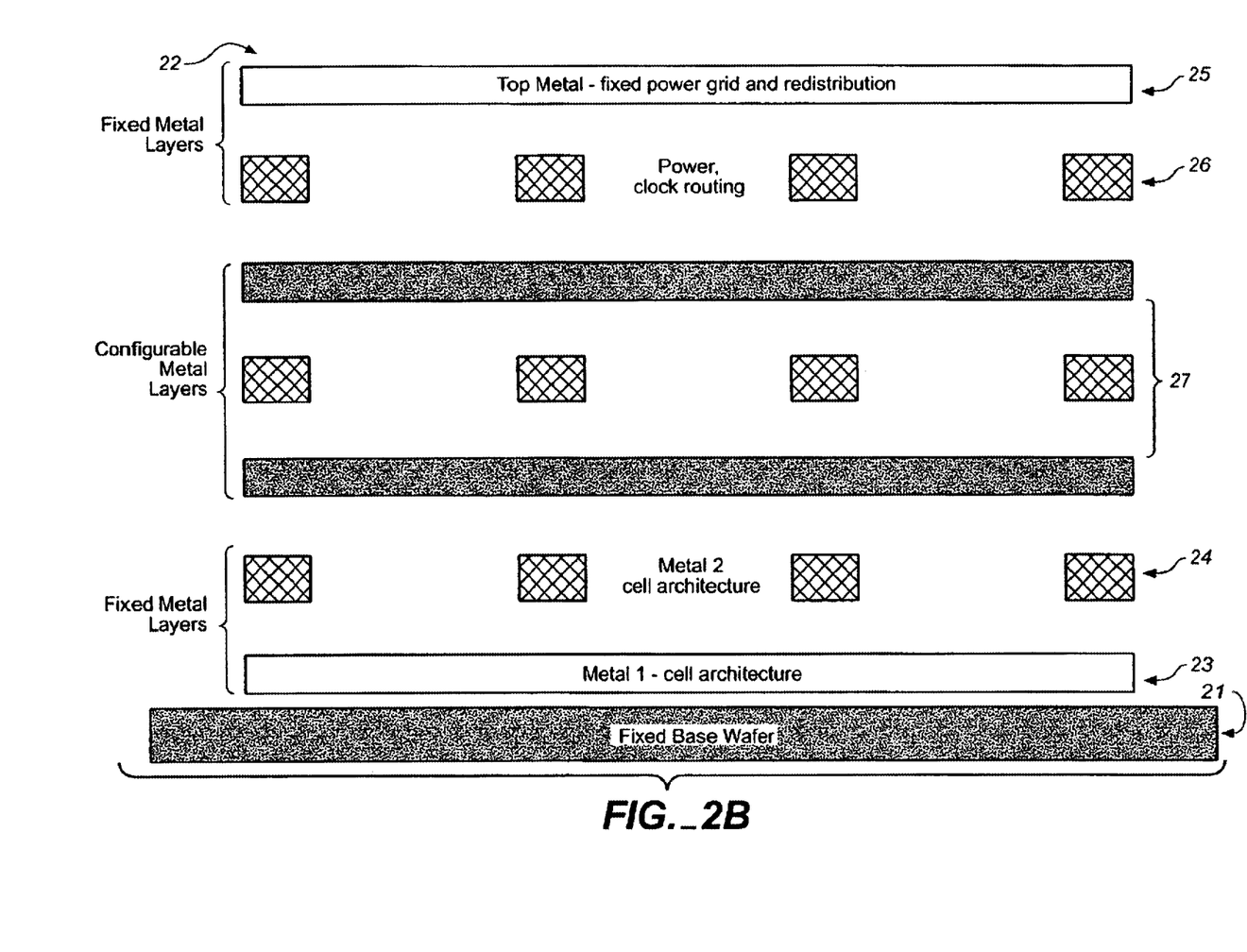
FIG. 2B is a diagram schematically illustrating a cross sectional view of an Embedded-Array ASIC showing an example of layer allocation in accordance with one embodiment of the present invention.

FIG. 2B schematically illustrates a cross sectional view of an Embedded-Array ASIC 22 showing an example of layer allocation in accordance with one embodiment of the present invention. In this example, a base wafer 21 has a fixed layer structure, and Matal-1 and Metal-2 layers 23 and 24 are also fixed metal layers and used to define the cell architecture. The top mental layer 25 is used for the fixed power grid and redistribution, and the second top metal layer 26 is used for power and clock routing. The intermediate layers 27 are configurable metal layers used for implementing a custom design.

Figure 3:
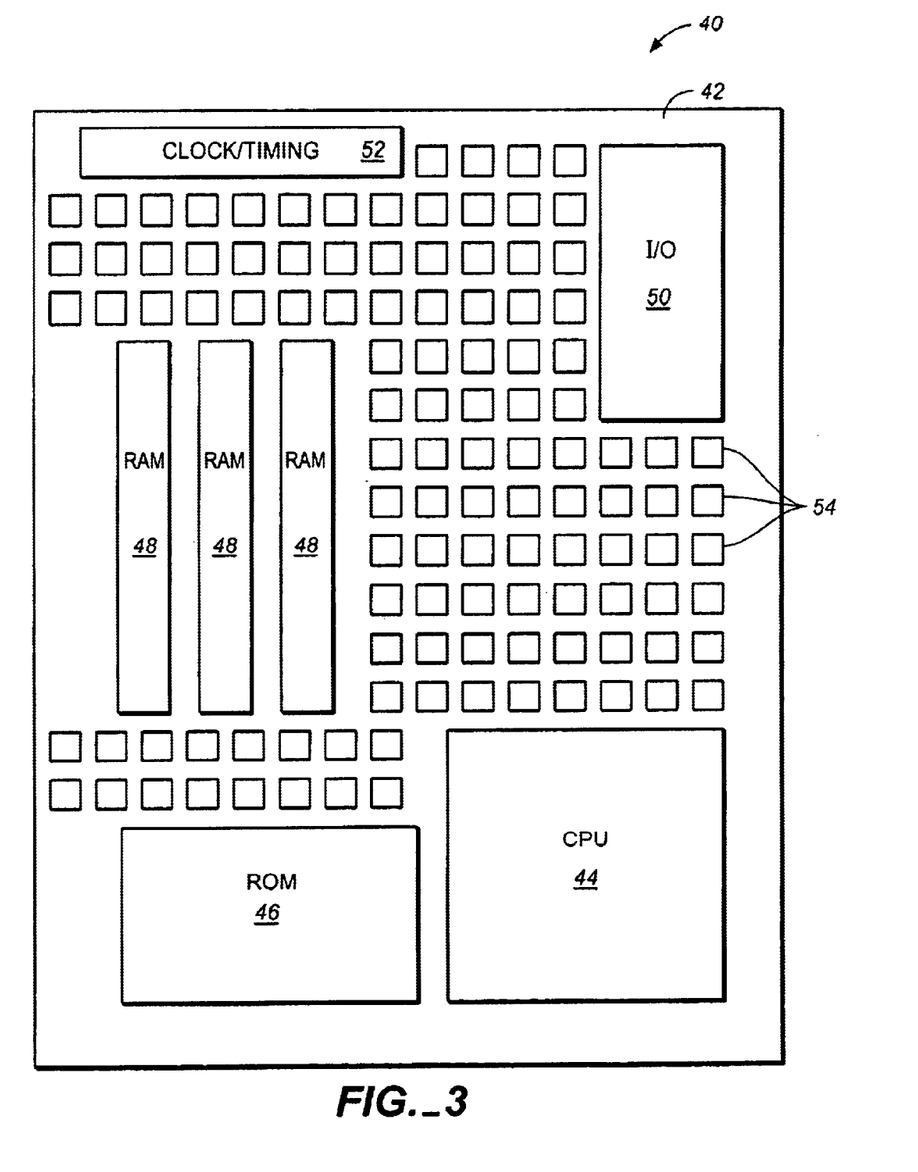
FIG. 3 is a diagram schematically illustrating a plan view of a base wafer structure of an Embedded-Array ASIC.

FIG. 3 schematically illustrates a plan view of a base wafer structure 40 of an Embedded-Array ASIC example. As shown in FIG. 3, the ASIC structure 40 includes a semiconductor substrate 42, on which a number of functional circuit blocks are formed. For example, such functional blocks include a central circuit unit (CPU) 44, read only memories (ROMs) 46, random access memories (RAMs) 48, input/output (I/O) interface unit 50, and clock/timing unit 52. These functional blocks may be modules commonly used for the circuit design class. The ASIC structure 40 further includes structured array of base cells 54. Each cell 54 represents a single logic element, such as a gate, as described above. FIG. 3 does not show any wiring or interconnections between functional blocks.

In an application to Array-Based ASICs, at least one bottom metal layer may be allocated to define the common part of the circuit design, since diffusion layers (up to gate layers) have typically predefined. Similarly to the above example, the contact layer and the first metal layer (for Metal-1), and optionally the second metal layer (for Matal-2) may be used to define the common part of the circuit design (functional modules used for the circuit design class).

A set of top metal layers is also allocated to implement the common part of the design, combined with the allocated set of bottom layers. In accordance with one embodiment of the present invention, the allocated set of top metal layers include the first top metal layer (for Metal-n) and optionally the second top metal layer (for Metal-n-1). Some selected functions, such as power connection and distribution, clock signal connection and distribution, and/or bus routing, are assigned to a few, preferably two, top metal layers. The allocated top layers may be more than two. These top metal layers may be used exclusively to perform these functions. For example, the allocated top metal layers are used to provide a power grid (or mesh) having fixed points of connections, and clock signal connections to wiring layers (signal lines) below and to the cells. In addition, the allocated top metal layers may provide bus routing. These allocated top metal layers are assigned with a fix pattern in accordance with the pattern (function definition) of the allocated bottom layers.

Referring back to FIG. 2A, in accordance with one embodiment of the present invention, the ASIC design may be characterized and optimized for the common design using the fixed patterns of the allocated set of bottom and top layers (108) before implementing the unique part of the design. For example, such optimization includes providing signals integration, improving signal to noise ratios, reducing clock jitter, arranging clock signal distribution, and/or arranging power distribution. This optimization or "pre-characterization" is advantageous because major elements pertinent to the optimization (such as I/O cells, memory cells, power grid, clock signal lines, etc.) are typically within the common design for the class, and thus individual optimization does not have to be conducted for each custom design.

The unique/custom part of the design (110) is implemented using the intermediate metal layers, i.e., metal layers above the allocated set of bottom layers and below the allocated set of top metal layers (112), in accordance with a given custom design. That is, a plurality of custom designs may be implemented on the same common part (typically, a common base wafer). This custom design implementation has some design constraint (restrictions on some design parameters) in order to provide connections to the fixed pattern of the allocated layers. However, the turn around time and manufacturing cost are reduced because of the reduced number of masks to be manufactured.

Figure 4:
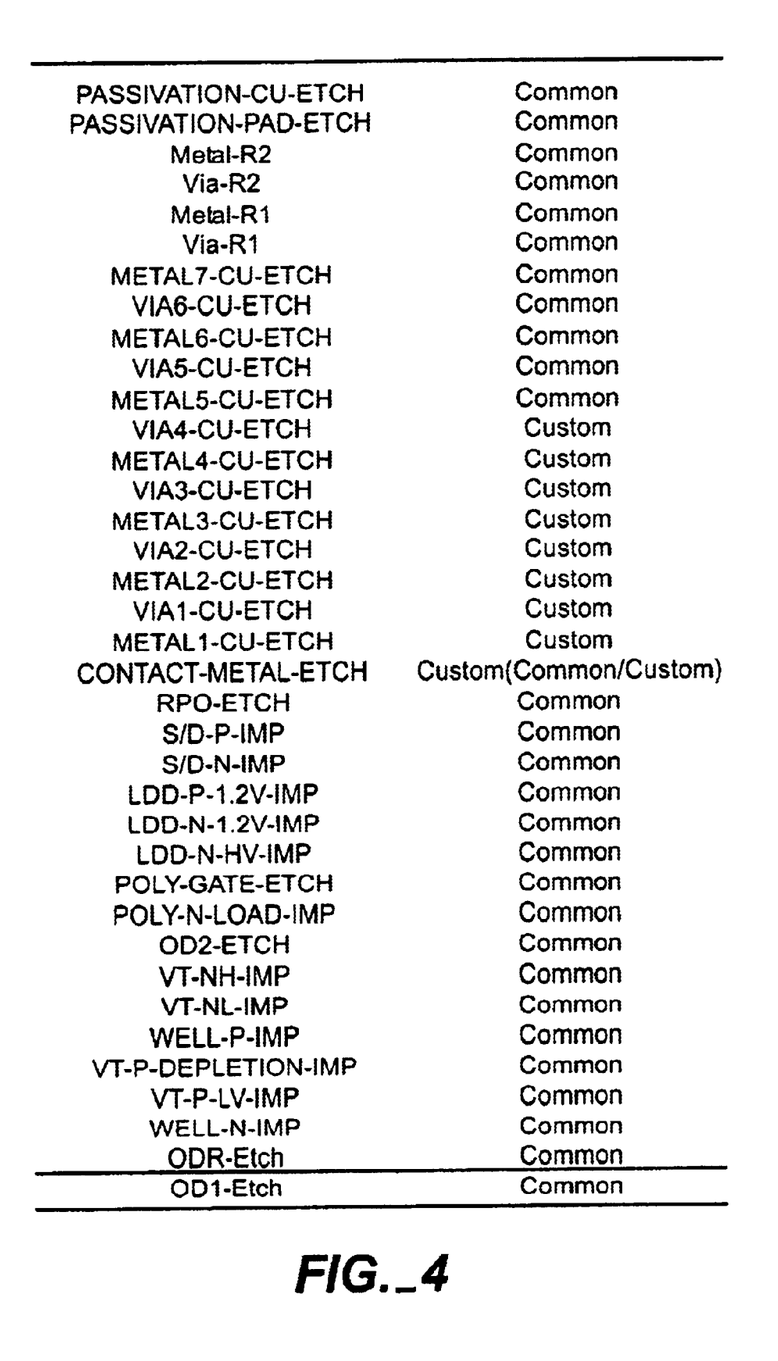
FIG. 4 is a table illustrating an example of allocating mask layers in accordance with one embodiment of the present invention.

FIG. 4 illustrates an example of allocating mask layers in accordance with one embodiment of the present invention. In this example, bottom layers under the contact layer (CONTACT-METAL-ETCH), and top layers from Metal-5 (METAL5-CU-ETCH) and above are allocated to the common part of the design. For example, coarse wires (METAL5 to METAL7) may be used for global routes, and wide wires (Metal-R1 and Metal-R2) may be used for I/O and power redistribution. The intermediate layers (CONTACT-METAL-ETCH to VIA4-CU-ETCH), which are typically fine wires, are allocated to implement a custom design. However, this layer allocation is by way of example and is not intended to be exhaustive or limiting in any way. For example, the contact layer (CONTACT-METAL-ETCH) may be included in the common part, depending on a given customer design. Also, one or more bottom metal layers (METAL1-CU-ETCH to METAL2-CU-ETCH) may be allocated to the common design. Alternatively, some upper metal layers (for example, METAL5-CU-ETCH and VIA5CU-ETCH) may also be used for custom design implementation. In accordance with a specific embodiment of the present invention, two bottom metal layers and two top metal layers are allocated to the common part of design. In addition, it should be noted that although this example includes seven wiring layers (up to METAL7), the number of the metal layers may vary.

The present invention is applicable to various ASIC design structures, including, but not limited to, Array-Based, Embedded-Array, and ASSP. When an ASIC design needs to be modified, the modification is implemented using the intermediate metal layers, as describe above. In order to accommodate the modification or a new design within the class, the intermediate metal layers are changed so as to re-route signal lines and wiring within the framework of the fixed layers. New masks are only required for the intermediate metal/wiring layers. This reduces the number of masks and thus process steps to implement a new design or change. Furthermore, the common part of the ASIC design may be optimized (or customized for that class of design) with respect to signals integration, signal to noise ratios, clock jitter, clock signal distribution, and/or power distribution. This also improves turn around time and reduces the cost for implementing the change/new design.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for designing an Application Specific Integrated Circuit (ASIC) structure on a semiconductor substrate, said method comprising:

defining a class of integrated circuit designs for the ASIC, the class of designs having a base wafer design which is common to the integrated circuit designs belonging to the class;

allocating at least one bottom metal layer to define base logic cells of a structured array formed on the semiconductor substrate, the allocated bottom metal layer having a fixed pattern for the base wafer design;

allocating at least one top metal layer to provide power and clock connections, the allocated top metal layer having a fixed pattern for the base wafer design; and implementing a customer design using intermediate metal layers above the allocated at least one bottom metal layer and below the allocated at least one top metal layer.

2. A method according to claim 1 wherein said allocating at least one bottom metal layer includes:

connecting transistors formed on the semiconductor substrate so as to define the base logic cells; and connecting the base logic cells so as to create modules.

3. A method according to claim 1 wherein said allocating at least one bottom metal layer includes assigning a fixed pattern to metal-1 and metal-2 layers.

4. A method according to claim 1 wherein said at least one bottom metal layer includes more than two bottom metal layers, and wherein said allocating at least one bottom metal layer includes assigning a fixed pattern to more than two bottom metal layers.

5. A method according to claim 1 wherein said allocating at least one top metal layer includes:

providing a power grid having fixed points of connections.

6. A method according to claim 5 wherein said allocating at least one top metal layer further includes:

providing clock signal connections to metal layers below and to the cells.

7. A method according to claim 5 wherein said allocating at least one top metal layer further includes:

providing bus routing.

8. A method according to claim 5 wherein said allocating at least one top metal layer further includes:

providing long distance low resistivity connections.

9. A method according to claim 1 wherein said at least one top metal layer includes at least two top metal layers, and wherein said allocating at least one top metal layer includes assigning a fixed pattern to at least two top metal layers.

10. A method according to claim 1 wherein said allocating at least one bottom metal layer includes:

placing memory cells and I/O cells in predetermined locations in the base wafer design.

11. A method according to claim 1, further comprising:

characterizing the ASIC for the base wafer design with the fixed patterns of the allocated bottom metal layer and the allocated top metal layer.

12. A method according to claim 11 wherein said characterizing includes at least one of:

analyzing signal integrity;
improving signal to noise ratios;
reducing clock jitter;
reducing inter or intra module clock skew;
arranging clock signal distribution; and
arranging power distribution.

13. A method for designing an Application Specific Integrated Circuit (ASIC) structure on a semiconductor substrate, said method comprising:

defining a class of circuit designs, the class having a common design part shared within the class and a custom design part variable for individual designs in the class;

allocating a set of bottom layers and a set of top metal layers to implement the common design part, the allocated sets of bottom layers and top metal layers having a fixed pattern for the class;

wherein at least one layer of the allocated set of bottom layers defining base logic cells of a structured array formed on the semiconductor substrate, and at least one layer of the allocated set of top layers providing power and clock connections and implementing the custom design part using intermediate metal layers above the allocated set of bottom layers and below the allocated set of top metal layers.

14. A method according to claim 13 wherein said allocating includes:

implementing a base wafer design using the allocated set of bottom layers; and providing power and clock connections to the base wafer design using the allocated set of top metal layers.

15. A method according to claim 14 wherein said implementing the base wafer design includes:

forming transistors in the semiconductor substrate;
connecting the transistors so as to define base logic cells of a structured array; and
connecting the base logic cells so as to create modules.

16. A method according to claim 14 wherein said implementing the base wafer design includes:

placing memory cells and I/O cells in predetermined locations for the common design.

17. A method according to claim 14 wherein said providing power and clock connections includes:

providing a power grid having fixed points of connections.

18. A method according to claim 17 wherein said providing power and clock connections further includes:

providing clock signal connections to metal layers below and to the cells.

19. A method according to claim 14 wherein said allocating further includes:

providing bus routing.

20. A method according to claim 14 wherein said allocating further includes:

providing long distance low resistivity connections.

21. A method according to claim 13, further comprising:

characterizing the ASIC for the common design using the fixed patterns of the allocated set of bottom layers and the allocated set of top metal layers.

22. A method according to claim 21 wherein said characterizing includes at least one of:

analyzing signal integrity;
improving signal to noise ratios;
reducing clock jitter, reducing inter or intra module clock skew;
arranging clock signal distribution; and
arranging power distribution.

23. A method according to claim 13 wherein the allocated set of bottom layers includes diffusion layers forming transistors.

24. A method according to claim 23 wherein the allocated set of bottom layers further includes a contact layer.

25. A method according to claim 24 wherein the allocated set of bottom layers further includes at least one metal layer above the contact layer.

26. A method according to claim 13 wherein said implementing the custom design part uses a contact layer and at least one metal layer above the contact layer.

27. A method according to claim 13 wherein said implementing the custom design part uses metal layers from metal-1 layer and above.

28. A method according to claim 13 wherein said implementing the custom design part uses metal layers from metal-2 layer and above.

29. A method according to claim 13 wherein said implementing the custom design part uses metal layers from metal-3 layer and above.

30. A program storage device readable by a machine, tangibly embodying a program of instructions executable by the machine to perform a method for designing an Application Specific Integrated Circuit (ASIC) structure on a semiconductor substrate, the method comprising:

defining a class of integrated circuit designs for the ASIC, the class of designs having a base wafer design which is common to the integrated circuit designs belonging to the class;

allocating at least one bottom metal layer to define base logic cells of a structured array formed on the semiconductor substrate, the allocated bottom metal layer having a fixed pattern for the base wafer design;

allocating at least one top metal layer to provide power and clock connections, the allocated top metal layer having a fixed pattern for the base wafer design; and implementing a customer design using intermediate metal layers above the allocated at least one bottom metal layer and below the allocated at least one top metal layer.

31. A program storage device according to claim 30 wherein the method further comprising:

characterizing the ASIC for the base wafer design with the fixed patterns of the allocated bottom metal layer and the allocated top metal layer.

32. A program storage device readable by a machine, tangibly embodying a program of instructions executable by the machine to perform a method for designing an Application Specific Integrated Circuit (ASIC) structure on a semiconductor substrate, the method comprising:

defining a class of circuit designs, the class having a common design part shared within the class and a custom design part variable for individual designs in the class;

allocating a set of bottom layers and a set of top metal layers to implement the common design part, the allocated sets of bottom layers and top metal layers having a fixed pattern for the class; wherein at least one layer of the allocated set of bottom layers defining base logic cells of a structured array formed on the semiconductor substrate, and at least one layer of the allocated set of top layers providing power and clock connections and implementing the custom design part using intermediate metal layers above the allocated set of bottom layers and below the allocated set of top metal layers.

33. A program storage device according to claim 32 wherein the method further comprising:

characterizing the ASIC for the common design using the fixed patterns of the allocated set of bottom layers and the allocated set of top metal layers.

* * * * *